United States Patent
De Sagazan et al.

(10) Patent No.: US 7,915,176 B2
(45) Date of Patent: Mar. 29, 2011

(54) DEVICE COMPRISING A FIELD OF TIPS USED IN BIOTECHNOLOGY APPLICATIONS

(75) Inventors: Olivier De Sagazan, Rennes (FR); Matthieu Denoual, Bruz (FR)

(73) Assignee: STMicroelectronics Crolles 2 SAS, Crolles (FR)

( * ) Notice: Subject to any disclaimer, the term of this patent is extended or adjusted under 35 U.S.C. 154(b) by 935 days.

(21) Appl. No.: 11/478,858

(22) Filed: Jun. 30, 2006

(65) Prior Publication Data
US 2007/0020786 A1 Jan. 25, 2007

(30) Foreign Application Priority Data
Jul. 5, 2005 (FR) ...................................... 05 52044

(51) Int. Cl.
*H01L 21/302* (2006.01)
(52) U.S. Cl. .... 438/735; 438/911; 445/50; 257/E21.404
(58) Field of Classification Search .................... 216/11; 257/E21.404; 438/735, 911; 455/50
See application file for complete search history.

(56) References Cited

U.S. PATENT DOCUMENTS

| | | | |
|---|---|---|---|
| 4,383,885 A | 5/1983 | Maydan et al. | |
| 4,969,468 A | 11/1990 | Byers et al. | |
| 5,111,260 A * | 5/1992 | Malhi et al. | 257/347 |
| 5,304,775 A | 4/1994 | Fujiwara et al. | |
| 5,457,041 A | 10/1995 | Ginaven et al. | |
| 6,577,785 B1 * | 6/2003 | Spahn et al. | 385/22 |
| 2002/0106960 A1 * | 8/2002 | Wilson | 445/50 |
| 2004/0060902 A1 | 4/2004 | Evans et al. | |

OTHER PUBLICATIONS

Branston et al. "Field Emission from Metal-Coated Silicon Tips," IEEE Transactions on Electron Devices, vol. 38,2329, 1991.*
Flamm et al. "The Design of Plasma Etchants," Plasma Chemistry and Plasma Processing, vol. 1,317, 1981.*

* cited by examiner

*Primary Examiner* — Evan Pert
*Assistant Examiner* — Matthew Reames
(74) *Attorney, Agent, or Firm* — Lisa K. Jorgenson; James H. Morris; Wolf, Greenfield & Sacks, P.C.

(57) ABSTRACT

A method for manufacturing a device including a field of micrometric tips, including forming a polycrystalline layer on a support; performing an anisotropic plasma etching of all or part of the polycrystalline layer by using a gas mixture including chlorine and helium, whereby tips are formed at the surface of the polycrystalline layer.

14 Claims, 4 Drawing Sheets

DEVICE COMPRISING A FIELD OF TIPS USED IN BIOTECHNOLOGY APPLICATIONS

BACKGROUND OF THE INVENTION

1. Field of the Invention

The present invention relates to a method for manufacturing a device comprising a field of micrometric tips. Such devices are used in biotechnology experiments as a support for the culture, the analysis, or the manipulation of biological cells.

2. Discussion of the Related Art

FIGS. 1A to 1D are cross-section views of structures obtained in successive steps of a known method for manufacturing a device comprising a field of micrometric tips.

In an initial step, illustrated in FIG. 1A, an etch mask formed of an assembly of blocks 2, 3 and 4 spaced apart from one another and arranged in a matrix is formed on a substrate 1. The substrate is, for example, a silicon wafer and the etch mask is formed of resin or of a silicon oxide layer.

In a next step, illustrated in FIG. 1B, an isotropic etching of the upper portion of substrate 1 is performed. The areas of substrate 1 not covered by blocks 2, 3, 4 are etched, as well as the lateral portions of the areas covered with blocks 2, 3, and 4 which are located close to the exposed areas. The etch time is provided for the "horizontal" etching under blocks 2, 3, 4 to be stopped when there only remain small unetched substrate portions under blocks 2, 3, 4. However, to ensure the holding of blocks 2, 3, and 4, that is, to avoid for them to fall, the remaining substrate portions must be sufficiently wide.

In a next step, illustrated in FIG. 1C, blocks 2, 3, and 4 of the etch mask are eliminated. A field of "truncated" tips 5, 6, and 7 is then obtained at the surface of substrate 1. The tip height is of one or a few microns and the inter-tip distance at least six times as large as the height of the truncated tips. The tip density then is of from 1 to 2 tips on a 100 $\mu m^2$ surface area.

FIG. 1D is a cross-section view of a portion of a device comprising a field of tips obtained according to the previously-described method and on which biological cells are placed. The average diameter of a biological cell being 15 $\mu m$, each cell is laid on a few tips of the device, between ¾ tips and some ten according to the cell shape.

A disadvantage of such a device is that it comprises tips of low height which are, what is more, truncated, that is, non-sharp. Such tips cannot be used to perform transfection operations consisting of piercing live cells to introduce into them elements, such as viruses, previously laid on the tips.

SUMMARY OF THE INVENTION

An object of the present invention is to provide a method for manufacturing a device comprising a field of micrometric tips having very sharp tips that enable performing transfection operations.

Another object of the present invention is to provide such a method which is easy to implement.

Another object of the present invention is to provide such a method which enables obtaining a device exhibiting a high density of tips.

To achieve these and other objects, the present invention provides a method for manufacturing a device comprising a field of micrometric tips comprising the steps of forming a polycrystalline layer on a support; performing an anisotropic plasma etching of all or part of the polycrystalline layer by using a gas mixture comprising chlorine and helium, whereby tips are formed at the surface of the polycrystalline layer.

According to an embodiment of the present invention, in the plasma etching, the gas flow rate of chlorine is higher than that of helium, the gas flow rate of chlorine for example being 130 $cm^3$/minute and the helium flow rate being 70 $cm^3$/minute.

According to an embodiment of the present invention, the polycrystalline layer comprises silicon.

According to an embodiment of the present invention, the support is a semiconductor substrate, such as a silicon substrate, covered with an insulating layer, such as a silicon oxide layer.

According to an embodiment of the present invention, the method comprises, prior to the plasma etch step, a deposition of a protection layer on the polycrystalline layer and the forming of through openings in the protection layer, tips being then formed at the surface of the polycrystalline layer inside of said openings.

According to an embodiment of the present invention, the method comprises, prior to the plasma etch step, an etching of the polycrystalline layer to form polycrystalline blocks, tips being then formed at the surface of the polycrystalline blocks.

According to an embodiment of the present invention, the method further comprises the forming according to a conformal deposition method of conductive films on the tips covering the polycrystalline blocks, each conductive film covering the tips of a crystal block extending in a conductive track placed on said support.

According to an embodiment of the present invention, the top diameter of the tips is at least ten times smaller than the tip height, the top diameter of the tips for example being 100 nm and the height of the tips for example being 10 $\mu m$, and the tip density is greater than 10 tips on a 100 $\mu m^2$ surface area.

The present invention also provides a device comprising at least one field of micrometric tips formed at the surface of a polycrystalline block placed on a support, each tip field being covered with a conductive film extending in a conductive track placed at the surface of the support and extending to reach a contact terminal.

According to an embodiment of the present invention, the device comprises a multitude of tip fields formed on crystal blocks arranged in a matrix.

According to an embodiment of the present invention, the device is used to evaluate the activity of biological cells placed on the tip fields of the device, a measurement device being connected to the contact terminals.

The foregoing and other objects, features, and advantages of the present invention will be discussed in detail in the following non-limiting description of specific embodiments in connection with the accompanying drawings.

DETAILED DESCRIPTION

Figure 1A:
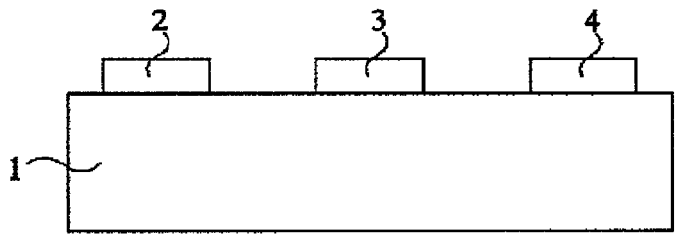
FIGS. 1A to 1D are cross-section views of structures obtained at the end of successive steps of a method, previously described, of manufacturing of a device comprising a field of micrometric tips.
Figure 1B:
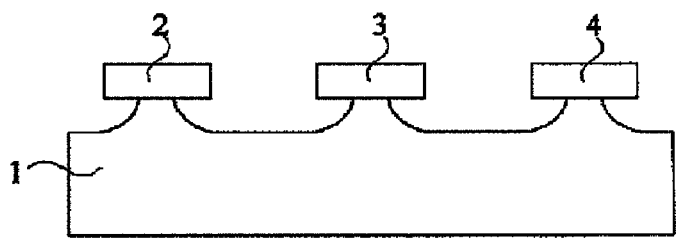
Figure 1C:
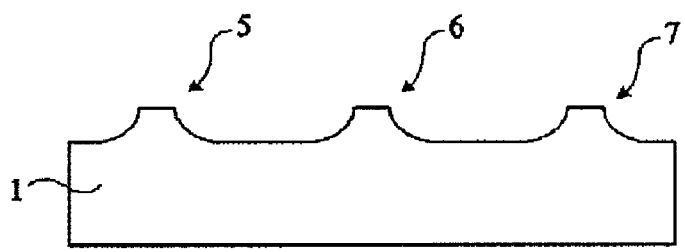
Figure 1D:
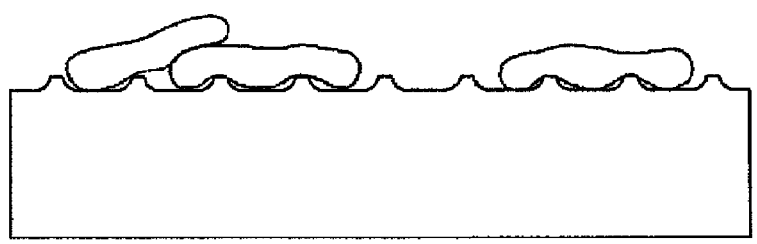

For clarity, the same elements have been designated with the same reference numerals in the different drawings. Further, the various drawings are not to scale.

The method of the present invention enables forming a tip field at the surface of a polycrystalline layer according to an etch method that provides a multitude of tips at the surface of the polysilicon layer.

Figure 2:
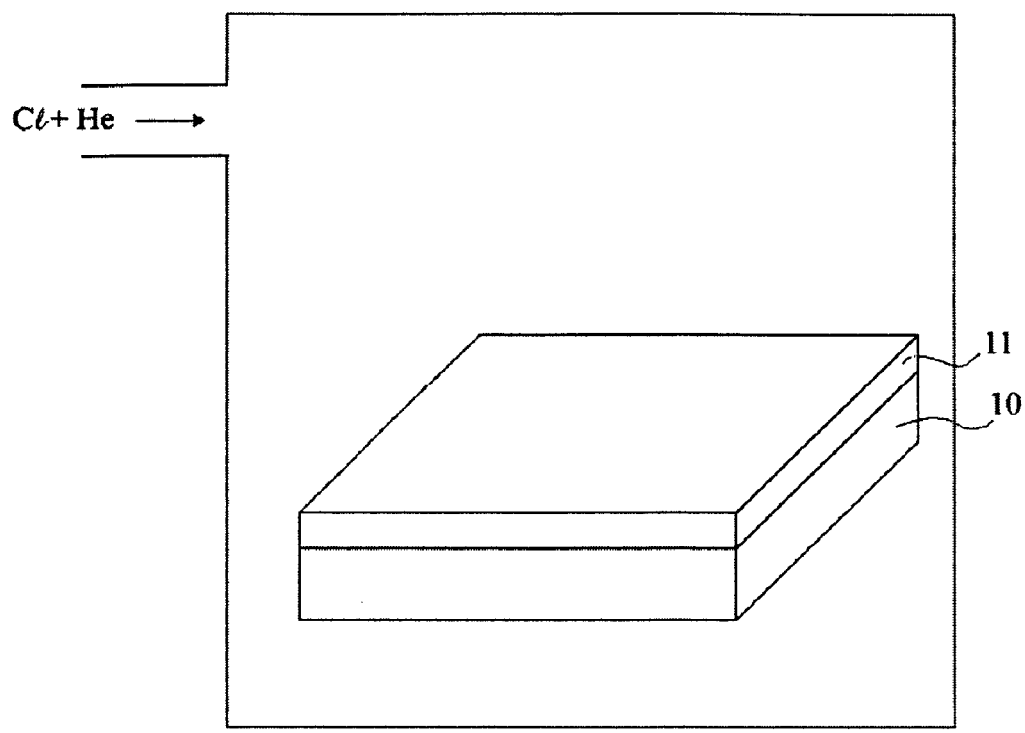
FIG. 2 is a diagram of an etch apparatus in which is implemented part of the manufacturing method according to the present invention.

FIG. 2 is a diagram illustrating an etch device in which a support wafer 10 covered with a polycrystalline layer 11 is placed. This device enables performing an anisotropic plasma etching of polycrystalline layer 11.

According to an aspect of the present invention, the gaseous plasma used to etch polycrystalline layer 11 contains chlorine and helium. The gaseous mixture may contain other neutral or catalyst elements.

Figure 3A:
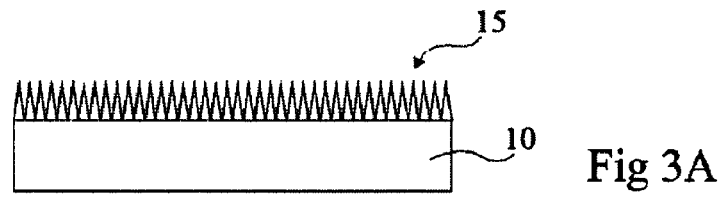
FIGS. 3A and 3B are cross-section views of examples of devices obtained at the end of the manufacturing method according to the present invention.
Figure 3B:
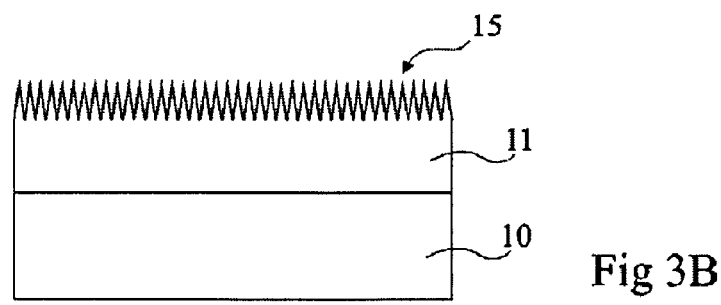

FIGS. 3A and 3B are cross-section views of examples of devices comprising a field of tips 15 obtained according to the previously-described method. The tip height is substantially proportional to the etch duration, or at least increases according to said duration. According to whether crystal layer 11 is thin or thick, the tips are formed across the entire thickness of the crystal layer or in the upper portion thereof, as respectively visible in FIGS. 3A and 3B.

According to the method of the present invention, it is possible to manufacture "large" tips having a height of 10 μm or more. Further, the obtained tips are "sharp" and exhibit at their end a diameter lower than 100 nm.

It should further be noted that the obtained tips are very close to one another. There thus is a high density of tips. For tips with a height of approximately 10 μm, the density is of several tens of tips, 30 or 40, for a 100 μm$^2$ surface area.

Figure 3C:
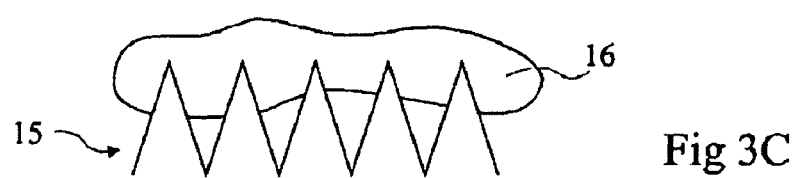
FIG. 3C is a cross-section view of a small part of the tip field of a device obtained according to the method of the present invention on which a biological cell is placed.

FIG. 3C is an enlarged cross-section view of the tips of a device obtained according to the method of the present invention, on which a biological cell 16 is placed. Due to the thinness of tips 15 and to their density, it is possible to "pierce" the cell in many locations. Further, the tips can penetrate deep into the cell and reach its nucleus.

Thus, a device obtained according to the method of the present invention enables performing transfection operations. For this purpose, the elements which are desired to be introduced into cells are deposited on tip field 15 prior to the placing of the cells on the tips. Given the thinness of the tips and their density, the external cell membrane does not resist and pierces. The introduction of tips into the cells enables bringing into the cells elements covering the tips down to the nucleus of the "impaled" cells.

A detailed example of implementation of the method according to the present invention is described hereafter in relation with FIGS. 4A to 4D.

In an initial step, an insulating layer 21 is formed on a substrate 20. Substrate 20 may be a silicon wafer and insulating layer 21 may be a silicon oxide layer, for example having a 500-nm thickness.

Figure 4A:
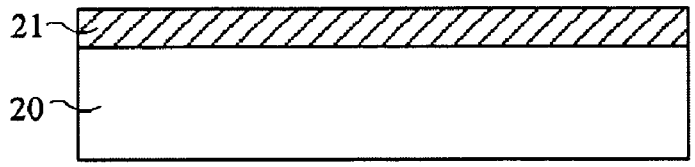
FIGS. 4A to 4D are cross-section or perspective views of structures obtained at the end of successive steps of an embodiment of the method according to the present invention.
Figure 4B:
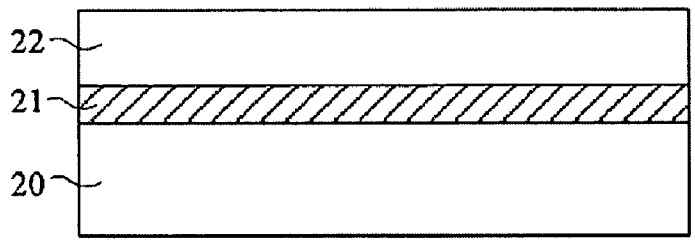

At the next step illustrated in FIG. 4B, a polycrystalline layer 22 is formed on insulating layer 21. For this purpose, the entire polycrystalline layer may be formed according to a chemical vapor deposition method. It is also possible to form a thin bonding layer by chemical vapor deposition, then to grow the rest of the layer in an epitaxial furnace. Polycrystalline layer 22 may be a silicon or silicon/germanium layer. The thickness of polysilicon layer 22 is selected according to the height of the tips which are desired to be subsequently formed, where the thickness of the polysilicon layer naturally has to be at least equal to the desired tip height. A polycrystalline layer exhibiting a thickness greater than the height of the desired tips will preferably be provided so that tips are "anchored" in the lower, unetched portion of the polycrystalline layer.

Figure 4C:
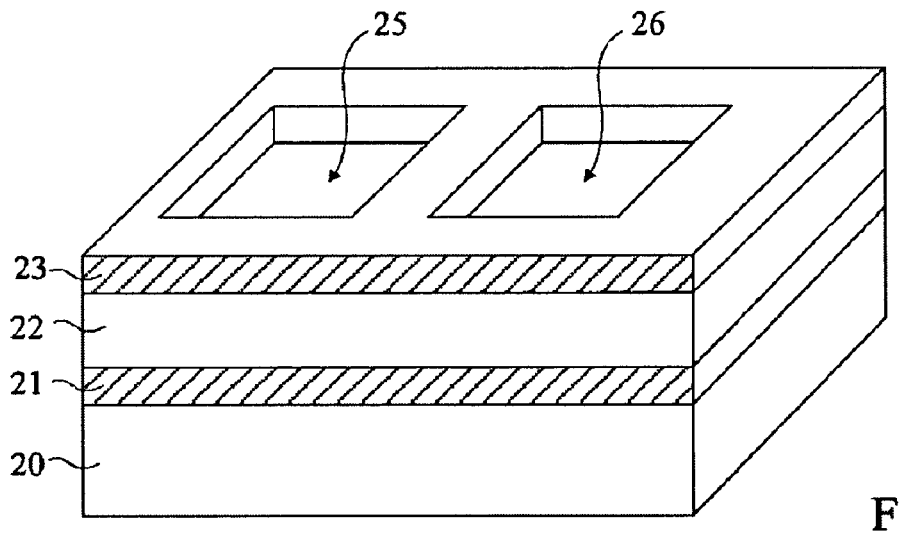

In a next step, illustrated in FIG. 4C, a protective layer 23 is deposited on polycrystalline layer 22. Through openings 25 and 26 are then formed in protective layer 23, for example, according to an HF-based wet etch method. Protective layer 23 may be a silicon oxide layer obtained by thermal oxidation of silicon or silicon/germanium polycrystalline layer 22. The thickness of protective layer 23 is, for example, 500 nm.

Figure 4D:
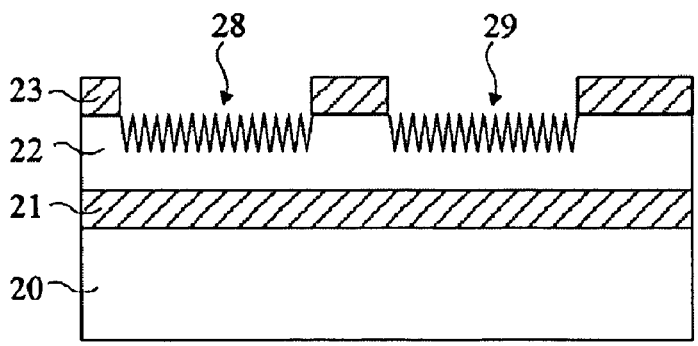

At the next step, illustrated in FIG. 4D, an anisotropic plasma etching of the exposed areas of polycrystalline layer 22 is performed, inside of openings 25 and 26. For this purpose, a gaseous mixture comprising chlorine and helium is used. Tip fields 28 and 29 are then obtained in each of openings 25 and 26 in the upper portion of polycrystalline layer 22.

In the case of a polycrystalline layer 22 formed of silicon, and of a protective layer 23 formed of silicon oxide, it is possible to obtain tips with a height on the order of 10 μm by performing an anisotropic plasma etching exhibiting the following characteristics. The chlorine gas flow rate is 130 cm$^3$ per minute and the helium gas flow rate is 70 cm$^3$ per minute. The gas pressure is 4,000 mT. The etch time ranges between 10 and 20 minutes. The power used for a device of type LAM 490 is 300 watts, the distance between electrodes being 0.5 cm.

Although two openings 25 and 26 are shown in FIG. 4D, the device formed according to the above-mentioned method may comprise a multitude of openings, for example, arranged in a matrix. Such a device enables placing in the openings various types of biological cells or various types of elements to be introduced into the cells by transfection. This enables performing various types of analyses.

Another example of embodiment of the present invention is described hereafter in relation with FIGS. 5A to 5D.

Figure 5A:
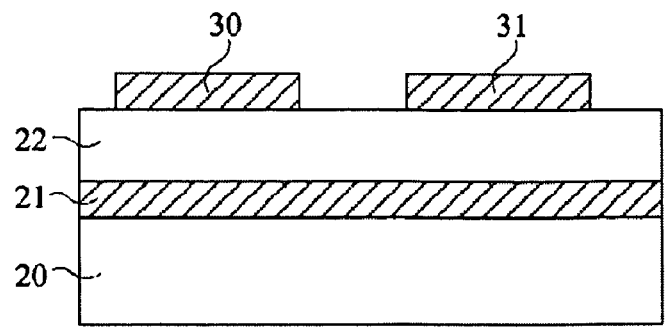
FIGS. 5A to 5D are cross-section or perspective views of structures obtained at the end of successive steps of another embodiment of the method according to the present invention.

In an initial step, shown in FIG. 5A, an etch mask is deposited on a structure such as that illustrated in FIG. 4B and comprising a stacking of a substrate 20, of an insulating layer 21, and of a polycrystalline layer 22. The etch mask comprises an assembly of protective blocks 30 and 31 placed on polycrystalline layer 22.

Figure 5B:
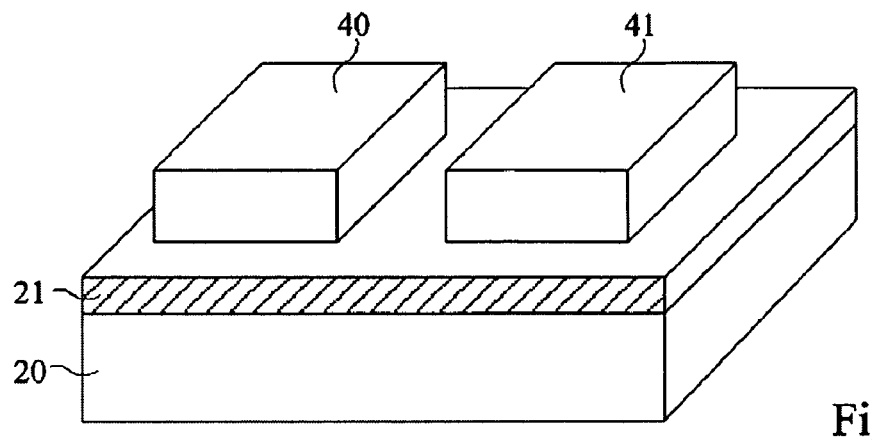

At the next step, illustrated in FIG. 5B, an anisotropic etching of polycrystalline layer 22 is performed according to a standard method providing polycrystalline blocks 40 and 41 placed under protective blocks 30 and 31. The etch mask, that is, protective blocks 30 and 31, is then removed.

Figure 5C:
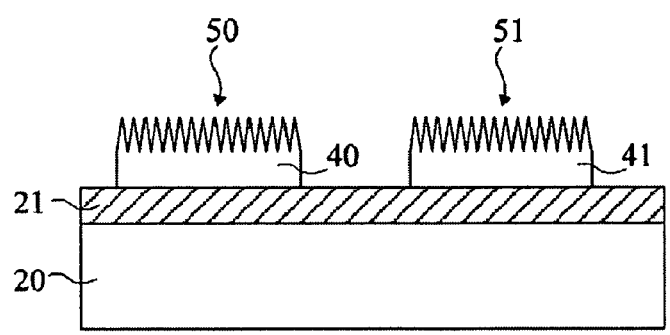

At the next step, illustrated in FIG. 5C, an anisotropic plasma etching of polycrystalline blocks 40 and 41 is performed by using a chlorine and helium gas mixture. Tip fields 50 and 51 formed in the upper portion of polycrystalline blocks 40 and 41 are then obtained.

Figure 5D:
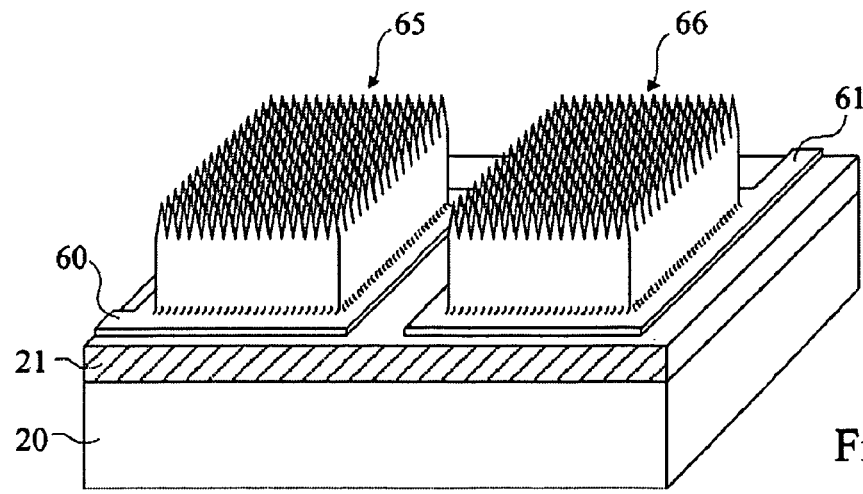

At the next step, illustrated in FIG. 5D, a thin conductive layer, for example, made of gold, is deposited over then entire previously-described structure. This thin conductive layer is then etched to be eliminated between polycrystalline blocks 40 and 41 except at certain previously-defined locations to form conductive tracks 60 and 61 on insulating layer 21. Polycrystalline blocks 40, 41 and tip fields 50, 51 are then covered with conductive films 65, 66 connected to conductive tracks 60, 61. Conductive tracks 60 and 61 connect conductive films 65, 66 covering tip fields 50 and 51 to contact terminals placed, for example, at the periphery of substrate 20.

Although two polycrystalline blocks 40 and 41 are shown in FIG. 5D, the device formed according to the above-mentioned method may comprise a multitude of polysilicon blocks arranged, for example, in a matrix. Many contact terminals are then provided and placed, for example, at the wafer periphery. These contact terminals are connected to the tip fields formed at the surface of the polycrystalline blocks by means of multiple conductive tracks placed on insulating layer 21.

An example of use of such a device is the following. The contact terminals are electrically connected to a measurement device. This enables evaluating the activity of biological cells placed on the tip fields by measuring, for example, values of potentials or electric currents.

The surface of the polycrystalline blocks of the device may be of a size identical to or lower than that of a biological cell. The device thus obtained enables analyzing a "tissue" of biological cells, such as a piece of skin, by placing this device against the tissue. It is then possible to analyze the activity of the various cells in the tissue. The activity of cells such as neurons of a neural network may, for example, be analyzed.

Of course, the present invention is likely to have various alterations, modifications, and improvements which will readily occur to those skilled in the art. In particular, those skilled in the art may devise other forms of device that can be obtained according to the method of the present invention.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for manufacturing a device comprising a field of sharp micrometric tips, the method comprising:
    forming a crystalline layer on a support such that the crystalline layer comprises a surface; and
    anisotropically etching at least a portion of the crystalline layer using a gas mixture comprising at least two gases, said anisotropic etching forming the sharp micrometric tips, at the surface of the crystalline layer, without using a mask in the region where the tips are formed.

2. The method of claim 1, wherein etching at least a portion of the crystalline layer using the gas mixture comprises etching at least a portion of the crystalline layer with chlorine gas and neutral gas.

3. The method of claim 2, wherein etching at least a portion of the crystalline layer using a gas mixture of chlorine gas and neutral gas comprises etching at least a portion of the crystalline layer using a gas mixture of chlorine gas and helium gas.

4. The method of claim 3, wherein etching the crystalline layer using a gas mixture of chlorine gas and helium gas comprises flowing the chlorine gas and the helium gas such that a gas flow rate of the chlorine is higher than that of a gas flow rate of the helium.

5. The method of claim 1, wherein forming a crystalline layer on a support comprises forming a polycrystalline layer on the support.

6. The method of claim 1, wherein forming a crystalline layer on a support comprises forming the crystalline layer on a silicon substrate; covered with an insulating layer of silicon oxide.

7. The method of claim 1, comprising, prior to etching at least a portion of the crystalline layer using the gas mixture, depositing a protection layer on the crystalline layer, and forming through openings in the protection layer, wherein said etching at least a portion of the crystalline layer using the gas mixture forms at least one micrometric tip in each opening.

8. The method of claim 1, comprising, prior to etching at least a portion of the crystalline layer using the gas mixture, etching the crystalline layer forming crystalline blocks, wherein said etching at least a portion of the crystalline layer using the gas mixture forms at least one micrometric tip at the surface of the crystalline blocks.

9. The method of claim 8, further comprising depositing conductive films on the micrometric tips and extending a conductive film in a conductive track disposed on the support.

10. The method of claim 1, wherein etching at least a portion of the crystalline layer using the gas mixture forming the micrometric tips comprises forming each tip with a tip height and distal diameter at an upper region thereof such that the distal diameter is at least ten times smaller than the tip height.

11. The method of claim 5, wherein forming a polycrystalline layer on a support comprises forming a silicon layer on the support.

12. The method of claim 4, wherein flowing the chlorine gas and the helium gas comprises flowing the chlorine gas at a flow rate of approximately 130 cm$^3$/minute and flowing the helium gas at a flow rate of approximately 70 cm$^3$/minute.

13. The method of claim 10, wherein forming each tip with a tip height and distal diameter comprises forming a tip with a distal diameter of approximately 100 nm and a height of approximately 10 μm.

14. The method of claim 1, wherein etching at least a portion of the crystalline layer using a gas mixture comprises creating a micrometric tip density greater than 10 tips on a 100 μm$^2$ surface area of the crystalline layer.

* * * * *